United States Patent [19]

Ponto et al.

[11] 4,359,602
[45] Nov. 16, 1982

[54] MULTIPLE INPUT AUDIO PROGRAM SYSTEM

[76] Inventors: Robert A. Ponto, 9418 Dawson Hill Rd.; Hardison G. Martin, 3700 Wilderness Trail, both of Louisville, Ky. 40299

[21] Appl. No.: 137,783

[22] Filed: Apr. 7, 1980

Related U.S. Application Data

[63] Continuation-in-part of Ser. No. 4,195, Jan. 17, 1979, abandoned.

[51] Int. Cl.³ .......................... H04H 1/02; H04R 1/02
[52] U.S. Cl. .................................. 179/1 B; 179/1 VL
[58] Field of Search ................. 179/1 AT, 1 B, 1 VL, 179/1 VC, 1 CN

[56] References Cited

U.S. PATENT DOCUMENTS 4,090,032 5/1978 Schrader ........................ 179/1 AT
4,149,032 4/1979 Peters ............................... 179/1 AT Primary Examiner—Joseph A. Popek
Attorney, Agent, or Firm—Edward M. Steutermann

[57] ABSTRACT

Multiple input sound amplifying and activation system including at least two microphones where an input channel is provided for each microphone. Each input channel provides a rectified signal to a summing device which sums the signals from the channels to generate a reference signal. Each input channel also includes a comparator to compare the reference signal with the signal received by the channel and provides a first control signal and second control signal in response to ratio between the reference signal and the channel input signal. The control signals operate a program signal amplifier to provide a program signal to an attenuator which attenuates the signal in response to the number of active channels.

4 Claims, 6 Drawing Figures

MULTIPLE INPUT AUDIO PROGRAM SYSTEM

BACKGROUND OF THE INVENTION

The present invention is a continuation-in-part of copending application Ser. No. 004,195, filed Jan. 17, 1979, now abandoned.

The present invention relates to multiple input audio systems, for example public address or sound systems which are useful in large meeting halls or in any application where multiple source communication is necessary and where several microphones are used to provide the input to the sound system.

In most applications, the individual microphone circuits to the output are sound activated by sound signals provided to the individual microphones.

In some arrangements, the output level is compensated by the number of active inputs and in other instances no compensation is provided. One such arrangement is shown in a booklet entitled "Field Effect Transistor Projects" published by Motorola, Inc. (TM) Phoenix, Ariz. (1966).

Examples of arrangements where the output is modified by the number of active inputs is shown in U.S. Pat. No. 3,814,856—Dugan, wherein a sound reinforcement system for a defined area is disclosed having a plurality of input channels and input signal sources. In this arrangement, the ambient noise level in the area served by the sound system is sensed and a signal is generated in response to the ambient noise level which is used as a reference signal to control the access of each of the input channels to the system. The disclosed system provides for each input channel to have a means to generate a direct current control signal proportional to the ambient noise which is then supplied to a comparator for a comparison with the reference signal. In this arrangement, a feedback system is provided around the comparator to maintain the access of the input channel to the output. The reference also provides an output system having a variable gain amplifier means where the gain is boosted inversely proportional to the square root of the number of active inputs. The arrangement disclosed is satisfactory in many applications but requires a continuous monitor for the ambient noise level for reference purposes so that devices in accordance with the reference are not useful where no accurate ambient noise level can be obtained. Furthermore, devices in accordance with the reference provide an arrangement where the reference signal bears no relation to the number of activated input channels.

In the regard, it will be noted that the reference provides an arrangement intended to boost the sum of all of the active information channels by an amount proportional to the magnitude of the control signal, regardless of the number of active input channels.

Another prior art arrangement is shown in U.S. Pat. No. 3,992,584—Dugan, which discloses a sound reinforcement system with a plurality of inputs to an output channel, where the total gain of the system remains constant.

In the arrangement disclosed in U.S. Pat. No. 3,992,584, the individual inputs channels are actuated by co-action between a reference signal which is proportional to the instantaneous sum of the alternating current signals generated by the active input channels. In addition, the alternating current signal is also filtered and rectified to provide a direct current reference signal to be compared with the filtered and rectified output signal of each input channel. It has been found that the use of the summed alternating current inputs for a reference signal leads to distortion in the system output as a result of phase cancellation which occurs in the summation of the alternating current reference signals. The distortions are disturbing and adversely affect the effectiveness of the system.

Additionally, since the reference (U.S. Pat. No. 3,992,584) provides an arrangement where each input channel includes a control and where the channel attenuation is achieved by means of a comparative summing amplifier with the summing amplifier as a reference signal, and a direct surrent signal generated from the output of the microphone the distortion occasioned by the frequency interference in mixing the signals is significant. This is particularly true since the attenuation of each input channel is responsive to the magnitude of the compared signal as opposed to a switched system. In many applications, the imbalance resulting from the summation of alternating current signals limits responsiveness of the input channel and causes distortion in the system output.

While the foregoing systems have proved satisfactory in certain applications, they present the problems of distortion or "dead spots," in certain applications and are unsuitable in other applications.

SUMMARY OF THE INVENTION

The present invention provides a program-operated sound system which provides a new and useful means for detecting active microphones and gating the microphones with a variable threshold determined by a summation of the total input signals.

Moreover, devices in accordance with the present invention attain these objectives without the necessity of highly specialized and custom-designed equipment.

Devices in accordance with the present invention provide an arrangement where a weak voice or sound can activate a microphone so long as the input signal exceeds a threshold level determined as a direct current summation of all other sources and provides an arrangement which is sufficiently sensitive to accept soft speech without the previously encountered irritating characteristics of intermittent transmission under marginal conditions.

Furthermore, it has been found particularly useful to attenuate the output level directly in a switched system in accordance with the number of active input microphones.

In accordance with the present invention provides a multiple source input sound amplifying and activation system including at least one first microphone means to generate first source input signal and at least one second microphone means to generate a second source input signal, at least one input channel means is provided for each microphone means, each input channel means including source input signal filter means to receive a source input signal and transmit a portion of the source input signal as a filtered input signal to full wave rectifier means to provide a full wave rectified direct current channel input signal of selected polarity, summing means to receive the direct current input signals from each of the input channel means and to provide a direct current reference signal proportional to the sum of a full wave rectified direct current source input signals received by the summing means, input channel comparator means for each input channel to receive and compare the reference signal with full wave rectified direct current source signal of the input channel and having an output operable to provide a first control signal in response to a first ratio between the reference signal and the direct current channel input source signal and a second control signal in response to a second ratio between the reference signal and the direct current channel input source signal, input signal amplifier means for each input channel to receive the source input signal from the microphone means to transmit an amplified source input signal to output amplification means, where the input signal amplifier means is operable in response to the first control signal and inoperable in response to the second control signal, multiple channel output means including output signal summing means adapted to receive the amplified source input signal from the input signal amplifier means of each activated input channel and attenuator means to receive the output signal from the output signal summing means and having input means to receive the first and second control signals from each of the input channel comparator means of each of the input channels where the attenuator means attenuates the output signal from the output signal summing means in response to the number of first signals received from the input channel comparator means.

Various other arrangements within the scope of the present invention will occur to those skilled in the art upon reading the disclosure set forth hereinafter.

BRIEF DESCRIPTION OF THE DRAWINGS

The invention is described with respect to the accompanying drawings wherein:

FIG. 1 is an illustration of one arrangement in accordance with the present invention where twelve microphones M1-M12 are provided in association with twelve input channels C1-C12. It will be understood that various numbers of input microphones and channels can be utilized in connection with the subject invention and, in fact, the number of channels can be more or less than twelve. The input channels are described hereinafter in somewhat more detail, but with reference to FIG. 1, each input channel includes a program output PO1-PO12 connected to a program buss PB which provides the information signals amplified and transmitted in the output section as described hereinafter.

Each input channel C1-C12 further includes a reference output RO1-RO12 which provides a reference signal as described hereinafter, to a mixing buss M where the signal from the mixing buss is summed in an amplifier 36 where the output signal from the summing amplifier 36 is transmitted to a reference buss B. A reference input RI1-RI12 is provided from reference buss B to input a reference signal to each of the input channels C1-C12 as described hereinafter.

Finally, each input channel C1-C12 is provided with an attenuation output AO1-AO12 which provides an attenuation signal to a digital attenuator 12 as discussed hereinafter and described more particularly in U.S. Pat. No. 4,239,938.

Figure 1:
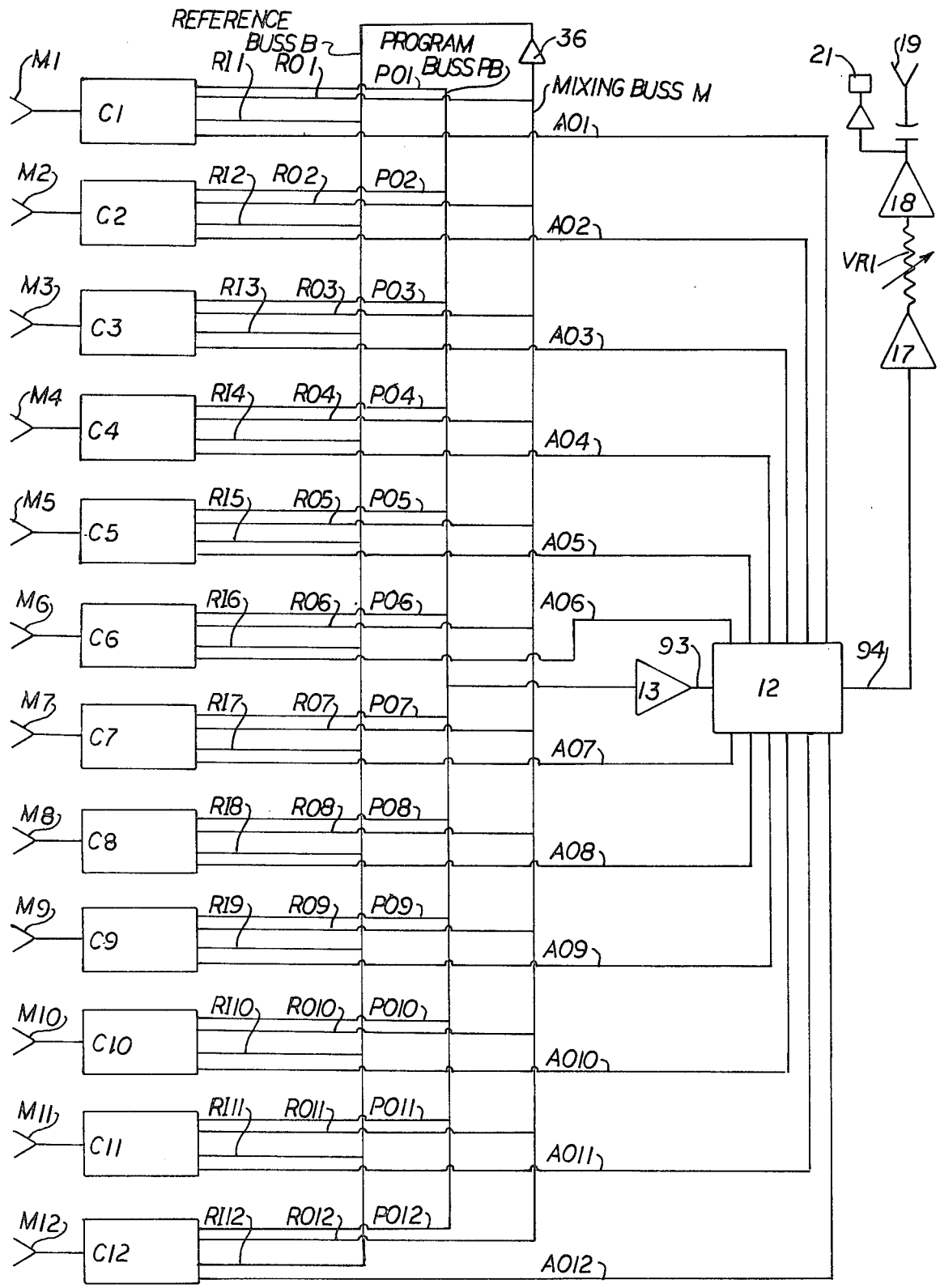
FIG. 1 is a simplified block diagram of one arrangement within the scope of the present invention.

As further shown in FIG. 1, the program outputs are transmitted to program buss PB by means of outputs PO1-PO12. A program output summing amplifier 13, for example a quad-operational amplifier Fairchild NE5534N can be provided to supply the combined programs of input channels C1-C12 to digital attenuator 12. Inputs AO1-AO12 from each of the input channels C1-C12 are supplied to attenuator 12 where the signals received from input channels C1-C12 can be of the logic or 0 and 1 character. The combined program signal supplied by summing amplifier 13 is attenuated in response to the number of active input channels C1-C12 as described hereinafter and the output signal 94 is supplied to a second current summing amplifier 17 of the same character as current summing amplifier 13. The output from current summing amplifier 17 is supplied through a variable resistor VR1 to an amplifier 18 which then supplies the program to an output, for example a loudspeaker 19, and to an output indicator to a volume unit meter 21 for monitoring the operation of the system.

Figure 2:
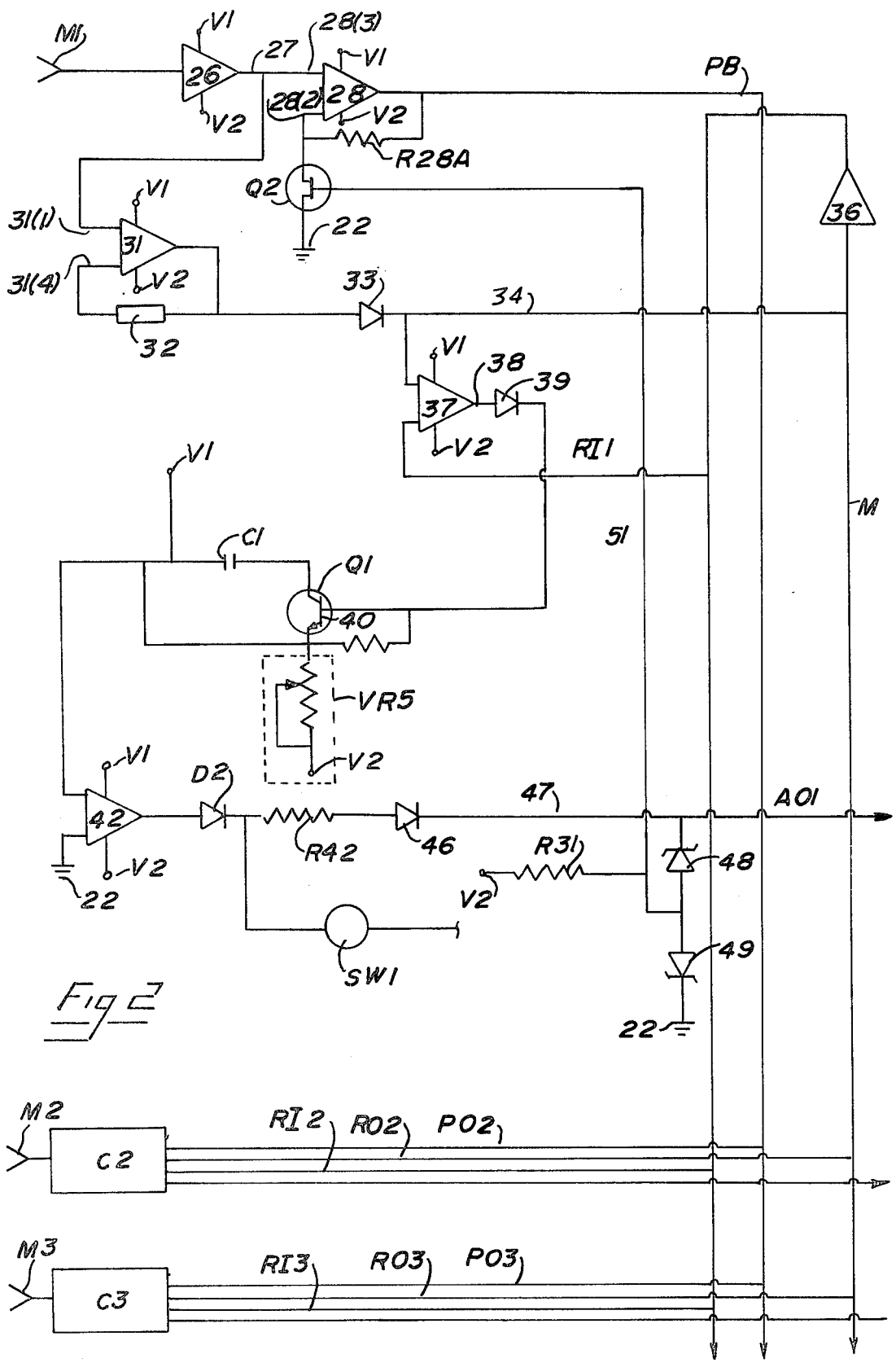
FIG. 2 is an arrangement showing a portion of the block diagram of FIG. 1 with a simplified block diagram of an input channel in accordance with the present invention.

Referring now to FIG. 2 which is an illustration showing the input channel C1 of FIG. 1 in more detail and indicating the presence of channels C2 and C3 where the position of microphones M1, M2 and M3 is likewise indicated, microphone M1 generates an input signal to a pre-amplifier 26 supplied with voltage V1, for example +15 volts and voltage V2, for example −15 volts where it is understood that the device is provided with V1 and V2 as an operational voltage where the output 27 from pre-amp 26 is supplied through the non-inverting input 28 (3) of an amplifier 28 which is supplied with voltage V1 and V2 as indicated. The inverting input 28 (2) of amplifier 28 is activated by the input channel control means as described hereinafter.

Output 27 from amplifier 26 is likewise supplied to the noninverting input 31 (1) of an operational amplifier 31, for example a Fairchild Model 4136, which is also powered by voltage V1 and V2 as indicated.

Operation amplifier 31 is provided with a gain control circuit 32, described hereinafter in more detail, connected to the inverting input 31 (4) of operational amplifier 31 and to the output 32 of amplifier 31 so that operational amplifier 31 performs as a bandpass filter.

Figure 4:
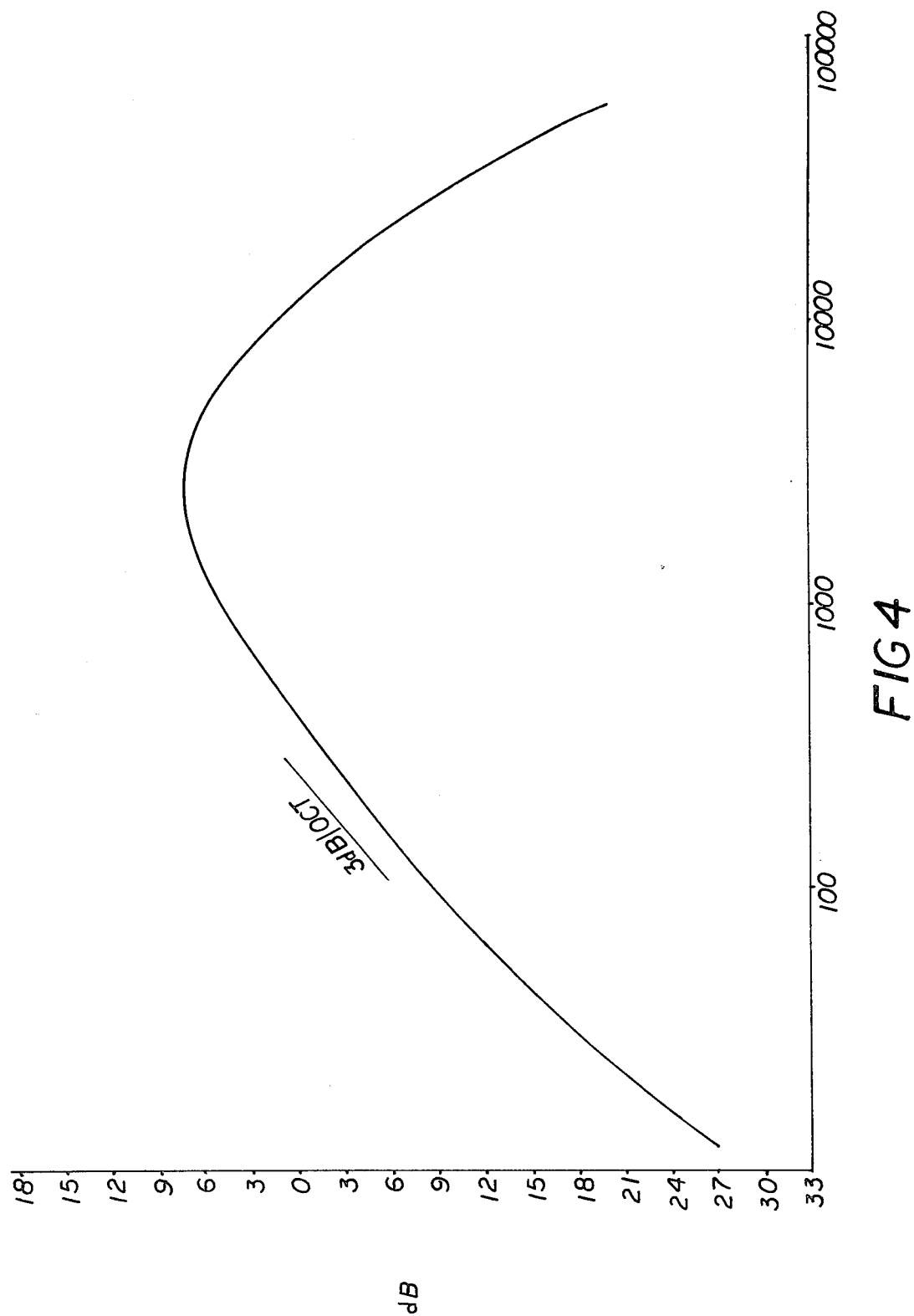
FIG. 4 is a chart showing a response curve in accordance with one feature of the present invention.

As shown in FIG. 4, it has been found that it is particularly advantageous to provide a bandpass filter operable in the frequency range of ten cycles per second to 5000 cycles per second, the normal audio frequency, so that the cutoff frequency of the filter is slightly in excess of 5000 cycles per second. It has been found particularly advantageous to utilize a filter of the type shown in FIG. 2 where the rise is three decibels per octave to the rollover frequency of 5000 cycles per second beyond which there is no particularly useful control information transmission.

Output (30) from filter 31 is then passed to a rectifier 33, described hereinafter where the output from filter 31 is rectified to provide a full wave rectified current having a selected DC voltage.

In accordance with one feature of the present invention the output 34 from rectifier 33 is supplied to a mixing amplifier 36 described hereinafter and to the non-inverting input of an operational amplifier 37, for example a Fairchild Model 4136, supplied by voltage V1 and V2 and adapted to act as a voltage comparator. Comparator 37 is also supplied with a reference voltage RI1, previously described, from from reference buss B. An output protection diode 39 is provided in output 38 from comparator 37 which is adapted to, advantageously, provide a logic signal dependent upon the relative inputs from 34 and RI1. For example, the output can be 0 or 1 depending upon which signal predominates where the output signal 38 determines, ultimately, whether the input signal from microphone M1 is passed to the output mode. Output 38 from comparator 37 is supplied to the base 40 of a transistor Q1 having its collector connected through capacitor C1 to the non-inverting input of an operational amplifier 42, for example a Fairchild Model A4136 provided as a buffer, as described in more detail hereinafter; transistor Q1, capacitor C1, and variable resistor VR5 are associated to establish a delay time before release in event of a signal change at the output 38 of comparator 37.

Advantageously, transistor Q1 and the associated elements C1 and VR5 are located at the output of comparator 37 so that the full effect of a comparison is realized by capacitor C1, whereas, if transistor Q1 and capacitor C1 were located elsewhere before comparator 37, comparison would not be fully changed in response to a transmission generated signal. The response of the system is dependent on the discharge rate of capacitor C1 which in turn in dependant on the resistance of VR5. The signal at output 43 is passed through a protection diode D2 and a resistor R42 to a light emitting diode 46 to indicate the presence of an operational signal at the output from amplifier 42. The signal 47 from diode 46 is connected to the anode of a diode 48 having its cathode connected to ground 22. The cathode of diode 48 is also connected through a resistor R3 to voltage V2 and by means of a connector 51 to the gate of a field effect transistor Q2 having the drain connected to ground 22 and the source to input 28 (2) of operational amplifier 28.

Output 47 from light emitting diode 46 is also connected to lead AO1 to a digital attenuator described hereinafter.

In operation, input channel 1, as described above, is provided with a microphone M1 which receives a signal where the input signal is pre-amplified by amplifier 26 and the program signal, or input signal is provided to input 28 (3) of amplifier 28 and to filter 31 where the signal is refined and filtered. The output 30 from amplifier 31 is supplied through a rectifier where the signal is rectified to provide a full wave filtered direct current signal which is supplied to one input of comparator 37. The other input of comparator 37 is connected to lead RI1, a reference input and when the signal at input 34 exceeds the reference signal of input RI1, a signal is provided in output 38, for example a positive signal or a 1 signal, which is then supplied to the base of transistor Q1 to impose a like signal on amplifier 42. The signal is then transmitted to the digital attenuator by means of lead AO1 and to the field effect transistor Q2 which turns on amplifier 28 to transmit the program signal to the audio buss for transmission to the output.

Figure 3:
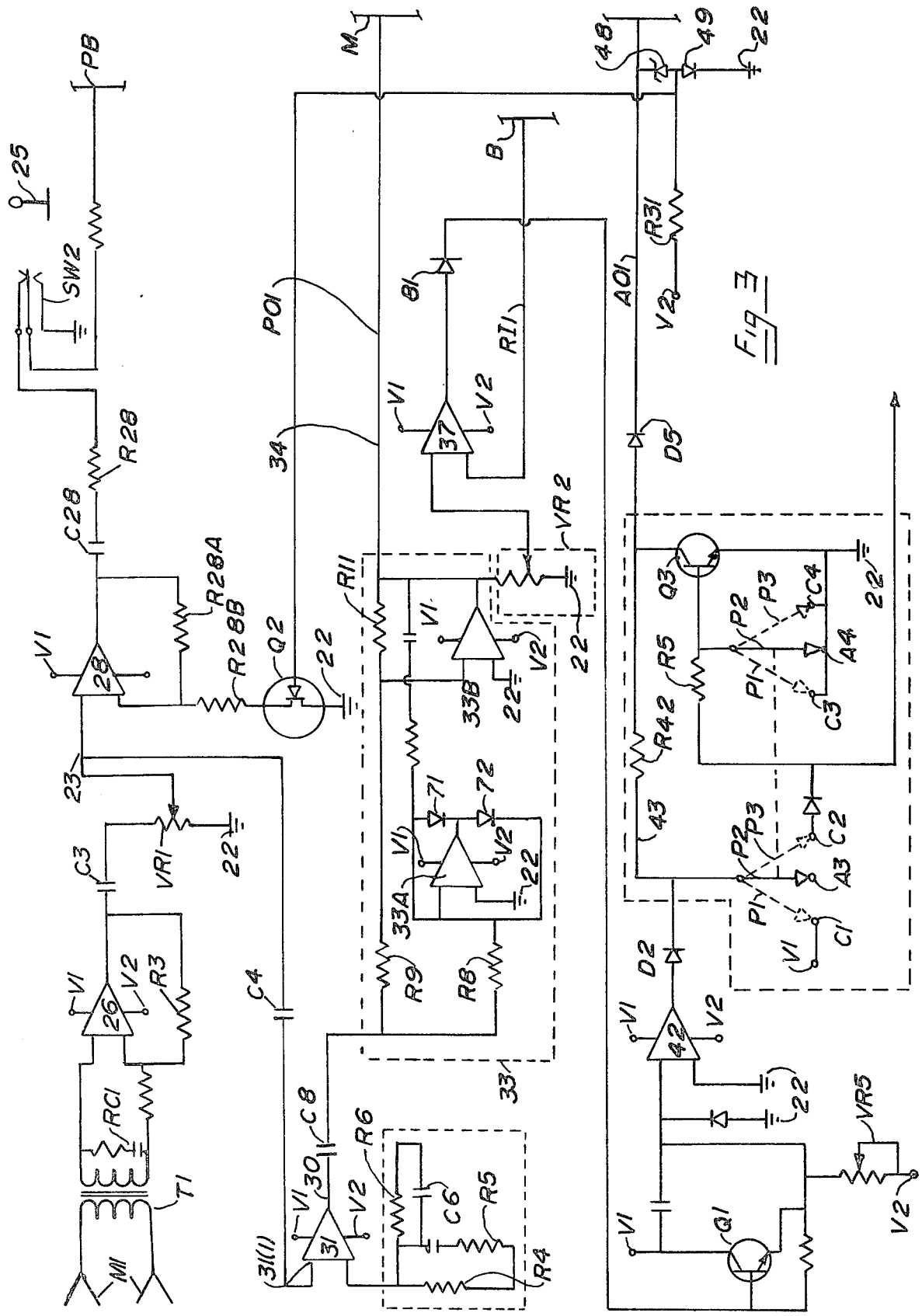
FIG. 3 is a detailed view of one input channel in accordance with the present invention.

Referring to FIG. 3, a master selector switch SW1 arrangement is shown to provide manual and automatic control of the input channel. A transistor Q3 is provided to act as an electronic switch to mute the normal signal 43 from amplifier 42. Associated switches A3 and A4 each having contacts C1, C2, C3 and C4 respectively are also provided. In position P1, voltage V1 is supplied to conduit 43 so the channel is activated by activation of field effect transistor Q2 at the same time switch A4 contacts contact C3 to make transistor Q3 to prevent transistor Q3 from making the channel.

When switch A3 is in position P2, the channel acts under automatic control. In this mode, switch A4 allows transistor Q3 to mute the channel shown when overridden by a signal from master selector buss 91.

When switch A3 and A4 are in position P3, transistor Q3 is muted so the signal from output 43 controls the channel shown as well as other channels connected to the master buss 91. Diode D5 is provided to prevent misoperation when more than one channel is in the master position.

Referring now to FIG. 3 which illustrates in more detail the input channel shown in FIG. 2, microphone M1 is provided in a transformer coupled circuit through a transformer T1 where preamp 26 is shown having a gain feedback circuit including a resistor R3 to provide a fixed gain for amplifier 26. Output 27 is then provided through a capacitor C3 to a variable resistor VR1, connected to ground 22, to adjust the output voltage 27A where output voltage 27A is then applied to input 23 of amplifier 28 and through a capacitor C4 to input 31 (1) of amplifier 31. As shown the gain of amplifier 31 is determined through a feedback circuit including resistors R4–R6 and capacitors C6, C7 to provide the selected filter characteristics. Output 30 from amplifier 31 is supplied, through a capacitor C8, to the input of rectifier 33 which includes operational amplifiers 33A and 33B, for example Fairchild Model 4136, where amplifier 33A is connected through resistor R8 to input 30 while diodes 71 and 72 are provided, as shown, for rectification where the non-inverting input of amplifier 33A is connected to ground 22. A resistor R11 is provided and connected to the inverting input of amplifier 33B in series through resistor 9 to the output 32 from amplifier 31. The non-inverting input of amplifier 33B is connected to ground 22 as shown. The output 34 from rectifier 33 is connected through connector RO1 to mixing buss M and to a variable resistor VR2 provided in series with ground 22 and provided to adjust the input to comparator 37. As mentioned previously, the inverting input to comparator 37 is connected by means of lead RI1 to reference buss B. A diode 81 is provided at the output from comparator 37 and is in series with the base of transistor Q1 as previously described.

The balance of the circuit shown in FIG. 3 is substantially identical to the input channel shown in FIG. 1.

Referring again to FIG. 1, program signal is supplied to program buss PB and supplied to summing amplifier 13, the output of which is supplied to digital attenuator 12. Each of the attenuator outputs AO1–AO12 from the input channel C1–C12 is supplied to digital attenuator 12. The total attenuation of the signal supplied from amplifier 13 increases with the increasing numbers of active input channels and advantageously in direct proportion to the increasing strength of the signal received from amplifier 13.

Figure 5:
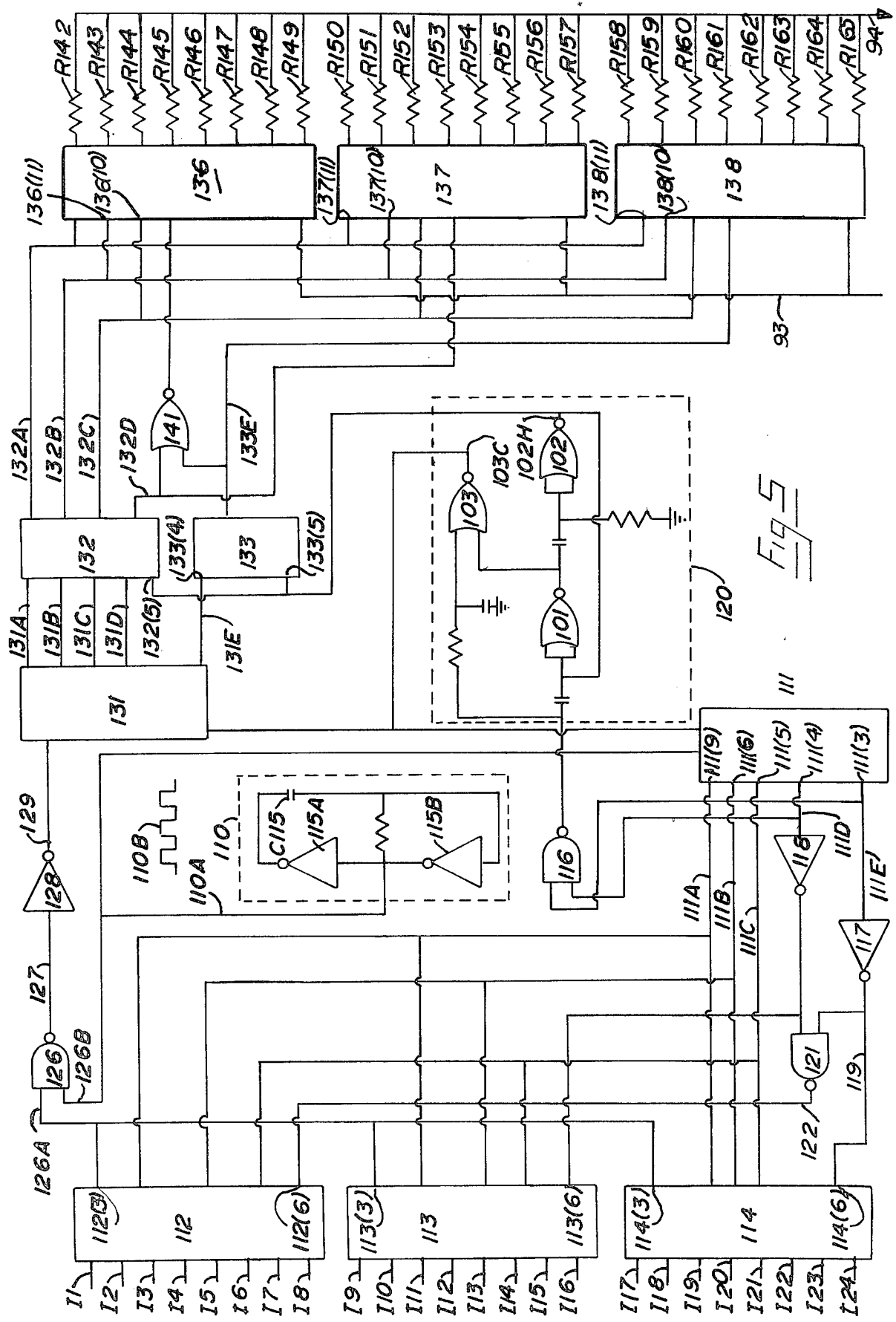
FIG. 5 is a schematic illustration of an attenuator arrangement within the scope of the present invention.

In this regard it will be understood that various arrangements can be utilized for attenuation of the signal and in the present example a digital attenuator in accordance with my copending application Ser. No. 004,197 filed Jan. 17, 1979 can be used. One such arrangement is shown in FIG. 5 for use in a system having 24 channels each providing an input I1-124 similar to inputs AO-1-AO12 of FIG. 1. Accordingly it will be seen that any number of input channels as illustrated in FIGS. 1-3 can be utilized depending upon the characteristics of the attenuator utilized.

The output 94 from digital attenuator 12 is supplied for amplification and adjustment and final output by means of speaker 19.

It will be understood that other arrangements within the scope of the present invention will become obvious to those skilled in the art upon reading the foregoing disclosure of one example of one arrangement within the present invention.

FIG. 5 shows an example of a digital attenuator 12 useful in the device hereinbefore described as also described in U.S. Pat. No. 4,239,938 where, output 110A from clock 110 is supplied to a binary counter 111, for example a seven stage ripple counter (part no. 4024, Radio Corporation of America, TM). Clock input 110A is supplied at the clock input terminal of binary counter 111 where output pins 111 (9) 111(6) and 111(5) are then connected as shown to input pins 112(6), 113(6) and 114(6) of three interconnected multiplexers/demultiplexers 112-114. For convenience, the output from pin 111(9) of counters 111 is designated output 111A, the output from pin 111(6) is designated as output 111B, and the output from pin 111(5) is designated as output 111C.

The outputs from binary counter 111, as is known in the art and described in more detail hereinafter, supply square wave signals of varying period depending on the number of input pulses which have been received by the counter at any particular time. The example of the present invention shown in the Figures utilizes the different signal periods at the different outputs as described hereinafter.

The output from pin 111(4) of binary counter 111, designated as output 111D, is supplied to the input of a NAND gate 116 for example a part no 4011 Radio Corporation of America TM and to the input of an inverter 118, for example, Signal Inverter part No. 4049, Radio Corporation of America TM.

Output from pin 111(3) designated as output 111E from binary counter 111 is supplied to the other input of NAND gate 116 and to a second inverter 117 similar to inverter 118.

Outputs 119 and 120 from inverters 117 and 118 are supplied to the inputs of a NAND gate 121 where the output 122 of NAND gate 121 and the outputs of 119 and 120 of inverters 117 and 118 are provided to the "inhibit" inputs of demultiplexers 112-114, (112(6)-113(6)-114(6).

In the example of the present invention shown in the Figures, three multiplexers/demultiplexers 112-114 are provided and connected to act as one unit. To accomplish this, the "inhibit" input (pin 6) designated respectively 112(6), 113(6) and 114(6) of each is utilized where its inhibit inputs provide for selective deactivation of the demultiplexers usually in response to a "1" or positive count at outputs 119, 120, or 122. Thus two of the multiplexers/demultiplexers are always off while the scan sequence described hereinafter is occurring in the active unit. The elements of binary counter 111, NAND gates 116 and 121 and inverters 117 and 118 provide the operative output for demultiplexers 112-114. Each demultiplexer is provided with a series of inputs I1-I8, I9-I16, I17-I24 as previously discussed recognizing that the device shown in FIG. 5 is receptive to 18 inputs while the device shown in FIGS. 1-3 provides only 12 channels to illustrate that any number of inputs can be utilized.

These inputs can be binary inputs which for example can be designated as "0" and "1". These input signals are received and ultimately transmitted to provide the selected attenuation by the multiplexer/demultiplexer inputs indicating, in the example shown, which of the input or microphone channels is active and the number of active channels is used to control the controlled signal from the output of amplifier 13.

Now with the reference to counter 111, the counter can, for example be a divide-by-eight counter with any number of stages sufficient to accomplish the objectives of the device. In the example shown, a seven stage counter is used but not all stages are needed for the application shown so a reset utilizing NAND gate 121 is provided as described hereinafter.

Figure 6:
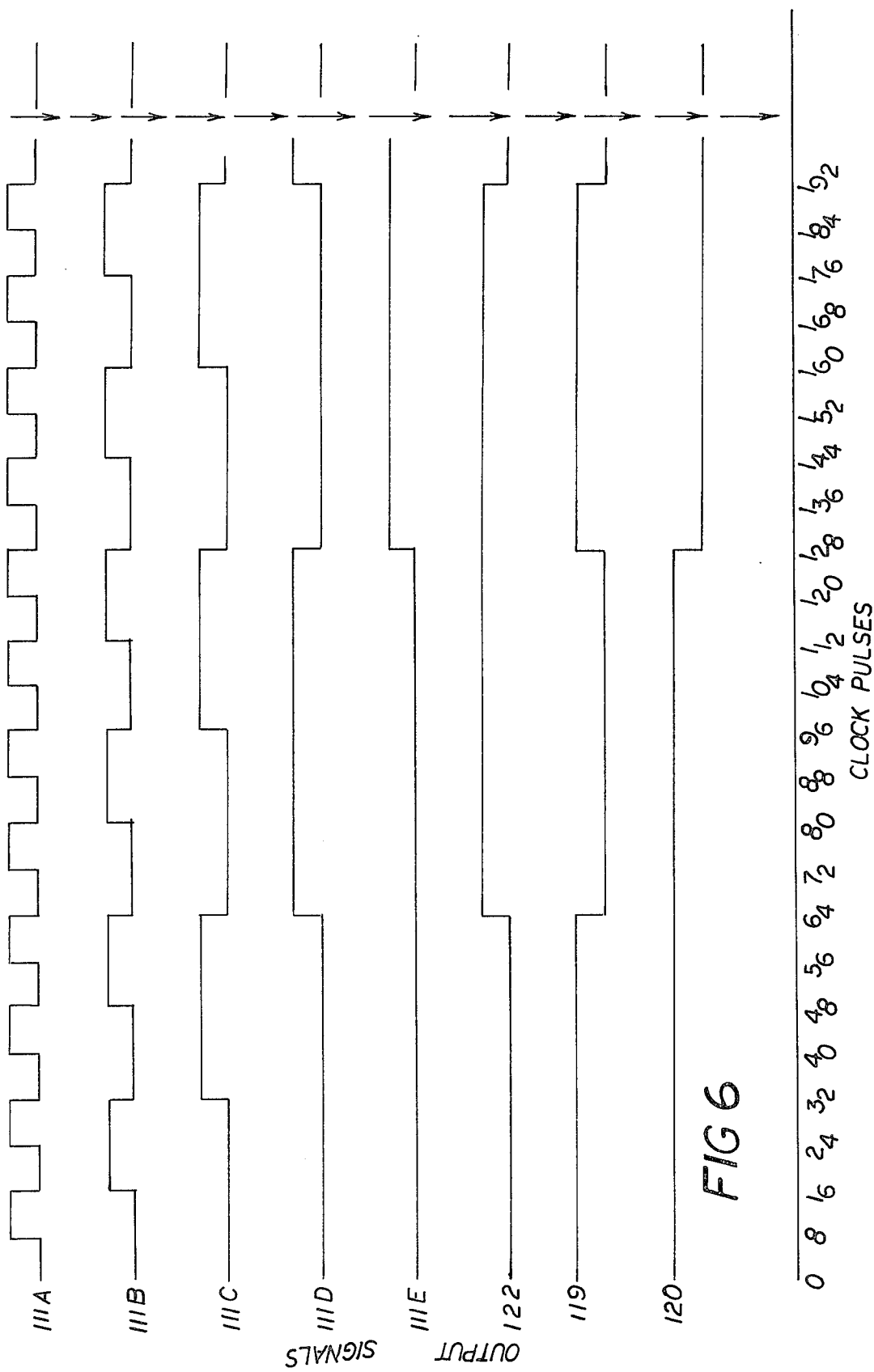
FIG. 6 is a graphic illustration of the operation of the attenuator of FIG. 6.

In operation as graphically illustrated in FIG. 6 with reference to outputs 111A-111E of counter 111 and inputs 120, 121 and 122 to multiplexer/demultiplexer 112-114, the sequence of the state of the various inputs and outputs are shown.

Initially, it should be recognized that outputs 111A-111E are normally "0" while multiplexers/demultiplexers 112-114 are on in response to a "0" input. In the arrangement shown, output 111E and 111D are "0" so inverter outputs 119 and 120 are "1" disable multiplexers/demultiplexers 113 and 114. Output 122 from NAND gate 121 is "0", as shown, so multiplexer/demultiplexer 112 is on and inputs I1-I8 are being scanned in response to the binary signals received from outputs 111A-111C of counter 11. The sequence of outputs 111A-111C for 64 counts is shown in Table #1 for the first phase of the operation for one cycle.

TABLE #1

STATE OF OUTPUTS 11A-11C AND CORRESPONDING ACTIVATION OF INPUTS OF ASSOCIATED THEN ACTIVE MULTIPLEXER/DEMULTIPLEXER

| Counter | Output | State | Multiplexer/Demultiplexer Input On |
|---------|--------|-------|-----|
| 111A | 111B | 111C | — |
| 0 | 0 | 0 | I1 |
| 1 | 0 | 0 | I2 |
| 0 | 1 | 0 | I3 |
| 1 | 1 | 0 | I4 |
| 0 | 0 | 1 | I5 |
| 1 | 0 | 1 | I6 |
| 0 | 1 | 1 | I7 |
| 1 | 1 | 1 | I8 |

When a multiplexer/demultiplexer output is on the signal in this case the binary signal "0" or "1" indicating an inactive or active input channel is transmitted to input 126A of NAND gate 126.

As illustrated in FIG. 6 after 64 counts when all 8 of the inputs I1-I8 of multiplexer/demultiplexer 12 have been scanned, output 111D goes high so that output 120 from the inverter 118 goes low or "0" enabling multiplexer/demultiplexer 113 while multiplexers/demultiplexers 112 and 114 are disabled so that by the sequence shown in Table #1 inputs I9-I16 are scanned. Finally, at the end of 128 clock pulses counter output 111D goes low disabling multiplexer/demultiplexer 112 to scan inputs I17-I24 to complete one counter cycle as described hereinafter.

At the end of 96 pulses, counter output 111D again goes high. It should be noted that during the last two phases of the cycle, outputs 111D and 111E were different. These outputs provide the input to NAND gate 116 so that at the completion of 96 clock pulses when both outputs 111D and 111E are "1" the output from NAND gate 16 goes to "0" initiating reset circuit 20 (described hereinafter) to reset counter 111 (and counter 31 described hereinafter) to start a new cycle.

During the period when each of the multiplexers/demultiplexers 112–114 are on, the input signals I1–I24 are noted at one input to NAND gate 126 as each clock pulse is transmitted from clock 110 to the other input to NAND gate 126 to sequence the input gate. The output 127 from NAND gate 126 is supplied to the input 127 of an inverter 128 for example a part no. 4049, Radio Corporation of America TM. The output 129 from inverter 128 is supplied to the input of a binary counter 131 for example part no. 4024 Radio Corporation of America TM where outputs 131A–131C corresponding to pins 109, 106 and 105 provide a summed binary number output. Outputs 131A–131D are supplied to a quad-latch 132, for example a part no 4042 Radio Corporation of America TM upon receipt of a signal at pin 132(5) from reset circuit 120 as described hereinafter. Output 131E from counter 131 is supplied to pin 133(4) of a second quad-latch 133, for example part no 4042, Radio Corporation of America TM to cooperate with output 132D of quad-latch 132 to select one of the multiplexer/demultiplexers 136–138 to attenuate the signal from amplifier 13.

Outputs 132A–132C of quad-latch 132 provide the binary number output while output 132D and 133E from quad-latches 132 and 133 provide the inhibit/disinhibit function for cooperative multiplexers/demultiplexers 137–139. Input 132A–132C from quad-latch 132 is supplied to pins 136(11), 137(11), 138(11) of demultiplexers 136–138 respectively. Output 132D of quad-latch 132 and 133E of quad-latch 133 are supplied to the input gates of a NAND gate 141 to selectively inhibit the operation of multiplexer/demultiplexer 136. Output 132D, as shown is supplied to the inhibit gate of demultiplexer 137 while output 133E is supplied to the inhibit gate of multiplexer/demultiplexer 138. Accordingly, operation of the multiplexer/demultiplexer to be activated is selected in accordance with the outputs from quad-latches 132–133. In accordance with one feature of the present invention, the input 94 from amplifier 13 is supplied through impedance devices for example resistors 142–165 in parallel on the input of multiplexers/demultiplexers 136–138 where each resistor is connected to one of the eight inputs of each of the multiplexers/demultiplexers 136–138. The binary code provided to one of the multiplexers/demultiplexers 136–138 by the previously described elements selects at least one of the inputs 142–165 to be utilized where the inputs to be utilized is then supplied to output 93 for transmission and where output 104 provides the attenuated signal to amplifier 17 of FIG. 1.

With reference again to FIG. 5, output from NAND gate 116 is supplied to a delay circuit 120 including NOR gate 101 102 and 103 adapted to provide an output 103C from NOR gate 103 and an output 102H from NOR gate 102 where output 102H is supplied to the load function pins 132(5) and 133(5) of quad-latches 132 and 133 while output 103C is provided to the reset of binary counters 111 and 131. Advantageously, there is a slight delay time between the pulse provided by output 102H and the pulse provided by output 103C where pulse 102H occurs first to load the quad-latches 132 and 133 from the output of binary counter 131, and subsequently, output 103C is activated to reset binary counters 111 and 131.

It will be understood that various other arrangements within the scope of the present invention will occur to those skilled in the art upon reading the foregoing disclosure and that the scope of the present invention is to be limited only by the claims appended hereto.

The invention claimed is:

1. A multiple input program active audio transmission system including:
    (a) at least two program input means, each to generate a system program input signal of varying frequency range in response to receipt of an input program;
    (b) at least two input signal channel means each of which is connected to one of said program input means and is responsive to the program input signal from the respective program input means and including:
        (i) input program signal filter means having an input to receive a portion of said program input signal and to provide a filtered input signal;
        (ii) input program signal rectifier means to receive said filtered input signal and provide rectification thereof to provide a rectified direct current input signal;
        (iii) comparator means having first input means to receive said rectified direct current input signal and second input means to receive a summation signal which is a function of rectified direct current input signals from all input channels and adapted to compare said rectified direct current input signal with said summation signal to provide a first comparator output signal in response to a first selected ratio between said rectified direct current input signal and said summation signal and to provide a second comparator signal in response to a second selected ratio between said rectified direct current input signal and said summation signal;
        (iv) program switch means having a program signal input to receive said program input signal and a program signal output with control means to transmit said program input signal to said program signal output upon receipt of said first comparator signal and to terminate transmission of said program input signal upon receipt of said second comparator signal;
    (c) summation means to receive said rectified direct current signal from each of said input signal channels to provide said summation signal to be supplied to said comparator means;
    (d) signal mixing means to receive program input signals from the outputs of each signal channel means to provide a selectively mixed audio output signal;
    (e) means to transmit said audio output signal to selected locations.

2. The invention of claim 1 wherein said input program signal filter means is adapted to provide an output having a slope of three decibels per octave in the output frequency range of 1000 cycles per second to 4000 cycles per second.

3. The invention of claim 1 wherein said first input means to said comparator means includes attenuation means to selectively modify said rectified direct current input signal.

4. The invention of claim 1 wherein said second input means to said comparator means includes attenuation means to selectively modify said summation signal.

* * * * *